(12) United States Patent
Starr et al.

(10) Patent No.: US 8,217,682 B1
(45) Date of Patent: Jul. 10, 2012

(54) OUTPUT DRIVER AND OPERATION THEREOF

(75) Inventors: Greg W. Starr, San Jose, CA (US); Toan D. Tran, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/854,107

(22) Filed: Aug. 10, 2010

(51) Int. Cl.
*H03K 19/094* (2006.01)

(52) U.S. Cl. .................................. 326/86; 326/83

(58) Field of Classification Search .......... 326/68, 326/80–84, 86, 87, 115; 327/108–112
See application file for complete search history.

(56) References Cited

U.S. PATENT DOCUMENTS

| | | | |
|---|---|---|---|
| 6,034,537 A * | 3/2000 | Burrows et al. | 326/33 |
| 6,218,858 B1 * | 4/2001 | Menon et al. | 326/39 |
| 6,933,743 B2 * | 8/2005 | Cecchi et al. | 326/16 |
| 7,071,739 B1 * | 7/2006 | Duzevik et al. | 327/108 |
| 7,183,805 B2 * | 2/2007 | Wang et al. | 326/86 |
| 7,656,198 B1 * | 2/2010 | Zhou et al. | 326/115 |
| 2006/0158223 A1 * | 7/2006 | Wang et al. | 326/86 |
| 2009/0245416 A1 * | 10/2009 | Wu et al. | 375/296 |

* cited by examiner

*Primary Examiner* — Shawki Ismail
*Assistant Examiner* — Crystal L Hammond
(74) *Attorney, Agent, or Firm* — W. Eric Webostad; LeRoy D. Maunu

(57) ABSTRACT

Embodiments of an integrated circuit driver, a method for operating integrated circuit driver, and predrivers are described. In one embodiment of the integrated circuit driver, a bias control circuit provides a bias signal for a first mode and a second mode. The bias signal has a first voltage level associated with operation in the first mode and a second voltage level associated with operation in the second mode. An output driver circuit receives the bias signal. In the first mode, the output driver circuit operates as a supply referenced driver, and in the second mode, the output driver circuit operates as a ground referenced driver.

20 Claims, 12 Drawing Sheets

OUTPUT DRIVER AND OPERATION THEREOF

FIELD OF THE INVENTION

An embodiment of the invention relates to integrated circuit devices ("ICs"). More particularly, an embodiment of the invention relates to an output driver and the operation thereof for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

There are many known types of interface protocols. Many of these interface protocols are supported in FPGAs. One point-to-point interface protocol proposed by Intel of Santa Clara, Calif., is known as QuickPath Interconnect ("QPI"). QPI is a ground referenced interface. One source-coupled interface protocol is known as Current Mode Logic ("CML"). CML is a supply referenced interface.

Supporting both QPI and CML interface standards in a single output driver is problematic. Accordingly, it would be desirable and useful to provide an output driver that supports both QPI and CML interface protocols that does not employ p-type transistors for data drivers.

SUMMARY OF THE INVENTION

One or more embodiments generally relate to an output driver and the operation thereof for an IC.

An embodiment relates generally to an integrated circuit driver. In such an embodiment, a bias control circuit provides a bias signal for a first mode and a second mode. The bias signal has a first voltage level associated with operation in the first mode and a second voltage level associated with operation in the second mode. An output driver circuit receives the bias signal. In the first mode, the output driver circuit operates as a supply referenced driver, and in the second mode, the output driver circuit operates as a ground referenced driver.

Yet another embodiment relates generally to a method for operating an integrated circuit driver. In such an embodiment, a bias signal is provided from a bias control circuit to an output driver circuit. The bias signal has a first voltage level associated with operation of the output driver circuit in a first mode and a second voltage level associated with operation of the output driver circuit in a second mode. The output driver circuit is operated in either the first mode or the second mode. In the first mode, the output driver circuit operates as a supply referenced driver, and in the second mode, the output driver circuit operates as a ground referenced driver.

Still yet another embodiment relates generally to a pre-driver. In such an embodiment, a first clamp circuit and a second clamp circuit are gated with a clamp signal. A first inverter is coupled to the first clamp circuit and configured to receive a first data input signal. A second inverter is coupled to the second clamp circuit and configured to receive a second data input signal. The first data input signal and the second data input signal are complementary signals. A first data output signal of the first inverter and a second data output signal of the second inverter are for an AC coupled mode or a DC coupled mode responsive to the selected signal.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
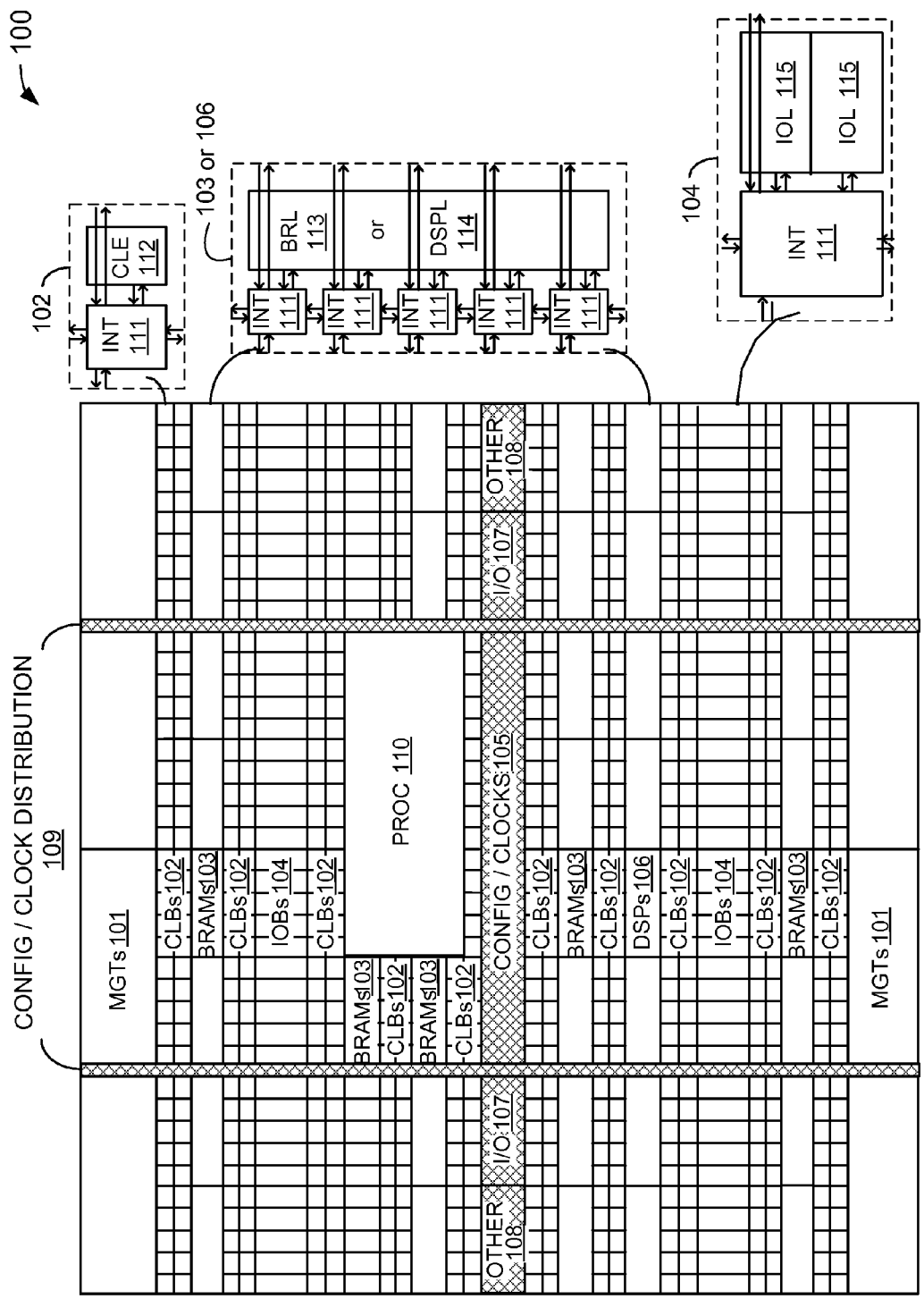
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several rows of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
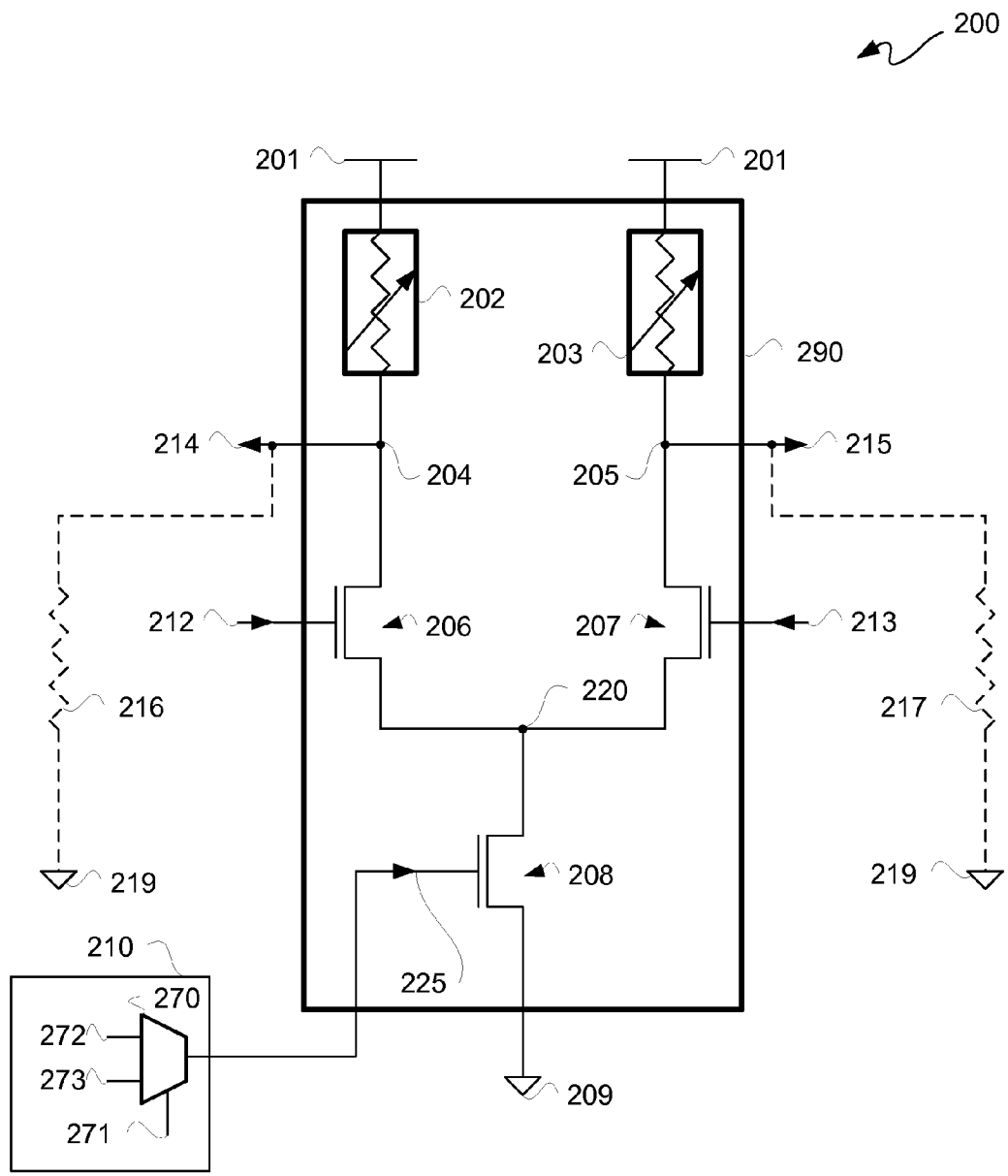
FIG. 2 is a block/circuit diagram depicting an exemplary embodiment of an output driver.

FIG. 2 is a block/circuit diagram depicting an exemplary embodiment of an output driver 200. Output driver 200 includes resistive loads 202 and 203, n-bias control circuit 210, and NMOS or n-type transistors 206 through 208.

Resistive loads 202 and 203 may be coupled to a supply voltage via a supply voltage node 201. Resistive loads 202 and 203 may be variable resistors, such as for example as described with reference to FIG. 5. Resistive load 202 may be coupled to output node 204 from which an output signal 214 may be sourced. Resistive load 203 may be coupled to output node 205 from which an output signal 215 may be sourced. It should be understood that output signals 214 and 215 may be for providing a differential output.

A drain node or region ("region") of transistor 206 is coupled to output node 204, and a source region of transistor 206 is coupled to common node 220. Transistor 206 is gated with a data signal 212. A drain region of transistor 207 is coupled to output node 205, and a source region of transistor 207 is coupled to common node 220. Transistor 207 is gated with data signal 213. Data signals 212 and 213 may be positive and negative logic signals for differential signaling.

A drain region of transistor 207 is coupled to common node 220. A source region of transistor 208 is coupled to a ground potential via ground node 209. It should be understood that a logic level associated with supply voltage 201 is a logic high level, such as AVTX for example, and a logic level associated with ground voltage of ground node 209 is a logic low level, such as Vss for example. Transistor 208 is gated with n-bias signal 225 output from n-bias control circuit 210. AVTX is a driver transmission voltage level that is greater than AVcc, which is another supply voltage level.

N-bias control circuit 210 is generally represented as a multiplexer 270. A multiplexer 270 indicates general operation; however, it should be understood that a more complex implementation of n-bias control circuit 210, such as described with reference to FIG. 7 for example, may be used. However, for purposes of clarity, it shall be assumed that multiplexer 270 is used for providing n-bias signal 225.

Multiplexer 270 is coupled to receive a mode select signal 271 as a control select. Mode select signal 271 may be used for switching between different output voltage levels for n-bias signal 225 for different modes, such as a CML mode and a QPI mode for example. Inputs 272 and 273 are for respective voltage levels associated with different modes. For example, for a QPI mode, input 272 is selected for output as n-bias signal 225 responsive to assertion of mode select signal 271, such as a logic 1 for example, and for a CML mode, input 273 is selected for output as n-bias signal 225 responsive to mode select signal 271 not being asserted, such as a logic 0 for example. Voltage input 272 may be AVcc, and voltage input 273 may be a CML control voltage. AVcc is less than AVTX, and CML control voltage is approximately a threshold voltage of transistor 208 plus an overdrive voltage of transistor 208. Such an overdrive voltage may be approximately one-half of the voltage level of AVcc.

For purposes of clarity by way of example and not limitation, some voltage, current, and resistance values are provided hereinbelow. However, it should be understood that these or other values may be used. It shall be assumed that supply voltage level, namely AVTX, provided at supply voltage node 201 is approximately 1.2 volts, and resistive loads 202 and 203 are each respectively approximately 50 ohms. It should be understood that a QPI interface is a point-to-point interface that uses ground or logic low referenced protocol. It shall further be assumed that AVcc is approximately 1.0 volts, and that CML control voltage is approximately 0.6 volts.

As a DC coupled interface, a QPI interface to another chip may include termination resistors, such as termination resistive loads 216 and 217 indicated by dashed lines. Resistive load 216 may be coupled between output node 204 and a ground node 219, and resistive load 217 may be coupled between output node 205 and ground 219. For a QPI, resistive loads 216 and 217 may actually be in a separate integrated circuit to which a differential signal output from output driver 200 is provided. In other words, output driver 200 may be in one integrated circuit, and another integrated circuit coupled to the integrated circuit in which output driver 200 is located may have resistive loads 216 and 217. Alternatively, resistive loads 216 and 217, which may be termination resistances, may be provided by discrete resistors coupled externally to pins of an integrated circuit to which a signal is provided from the integrated circuit in which output driver 200 is located. Thus, it should be understood that resistive loads 216 and 217 do not form part of output driver 200, but do affect voltages levels of output driver 200. Along those lines, for purposes of clarity by way of example and not limitation, it shall be assumed that resistive loads 216 and 217 are each approximately 50 ohms.

The term "ON" is used herein to refer to a transistor being gated so as to be in a fully or at least substantially conductive state as between source and drain regions. This is generally understood to be a saturation region of operation of a MOSFET. The term "OFF" is used herein to refer to a transistor being gated so as to be in a fully or at least substantially nonconductive state. This is generally understood to be in a linear or ohmic region of operation of a MOSFET when there is at least approximately no drain current and no drain-to-source voltage. The term partially ON is used herein to refer to a transistor being gated so as to be in a partially conductive state. This is generally understood to be in the linear region of operation of a MOSFET that is closer to the saturation region than zero drain current and drain-to-source voltage.

Figure 3:
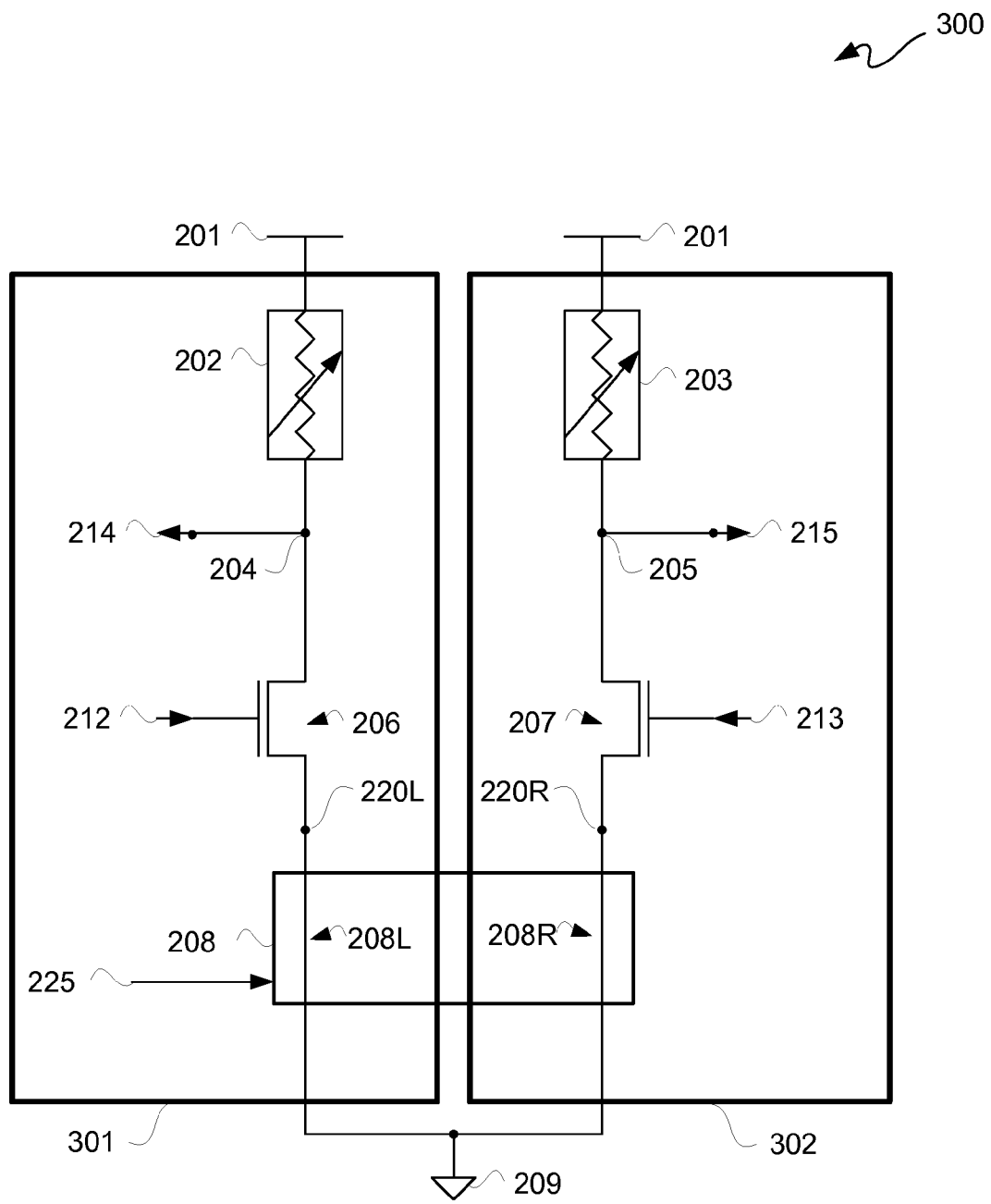
FIG. 3 is a block/circuit diagram of an exemplary embodiment of a QuickPath Interconnect operational mode of the output driver of FIG. 2.

Referring to FIG. 3, there is shown a block/circuit diagram of an exemplary embodiment of an operational mode 300 of output driver 200 of FIG. 2. More particularly, operational mode 300 is a QPI mode. With simultaneous reference to FIGS. 2 and 3, QPI mode 300 is further described.

N-bias signal 225 is pulled to a sufficiently high level of voltage such that NMOS transistor 208 appears as a virtual short. Thus as illustratively depicted in FIG. 3, common node 220 with respect to the right ("R") and left ("L") appears as two separate nodes, such as generally indicated as 220R and 220L, which may appear as virtual ground nodes, namely coupled to ground node 209 via transistor 208 when ON. In other words, when n-bias control signal 225 is sufficiently high, such as a "hard pull," output driver circuits of output driver 200 appear as separate single-ended drivers, namely such as a single-ended driver 301 and single-ended driver 302. Again, in an exemplary embodiment, n-bias signal 225 sourced from output of multiplexer 270 of FIG. 2 may be approximately 1.0 volts.

It should be understood that even though QPI is a ground referenced standard, it does not necessarily mean that a QPI implementation needs to pull completely to ground. Thus, as generally indicated in FIG. 3, transistor 208 may appear as two separate shorts, namely 208R and 208L, respectively for single-ended driver 301 and single-ended driver 302. In this QPI mode 300 for example, when transistor 207 is ON, node 205 is pulled down to approximately 0 volts, namely is pulled down to approximately ground potential of ground node 209. Furthermore, in QPI mode 300 for example, when transistor 207 is OFF, node 205 is pulled up to a supply voltage level of node 201 divided by a combination of resistive loads ("voltage divider") 203 and 217. For example, there is a swing voltage at node 205 for operation of single-ended driver 302 of approximately 0.006 to 0.6 volts using the example values provided.

Even though operation was described for single-ended driver 302, it should be understood that the complementary operation would apply for single-ended driver 301. Thus using the example values provided, if transistor 206 were ON, output node 204 would be at approximately 60 millivolts, and if transistor 206 were OFF, output node 204 would be at approximately 0.6 volts. Using the above-provided example values, in QPI mode 300, current from common node 220 to ground 209 may be at most approximately 24 milliamps (e.g., 1.2 volts/50 ohms).

Figure 4:
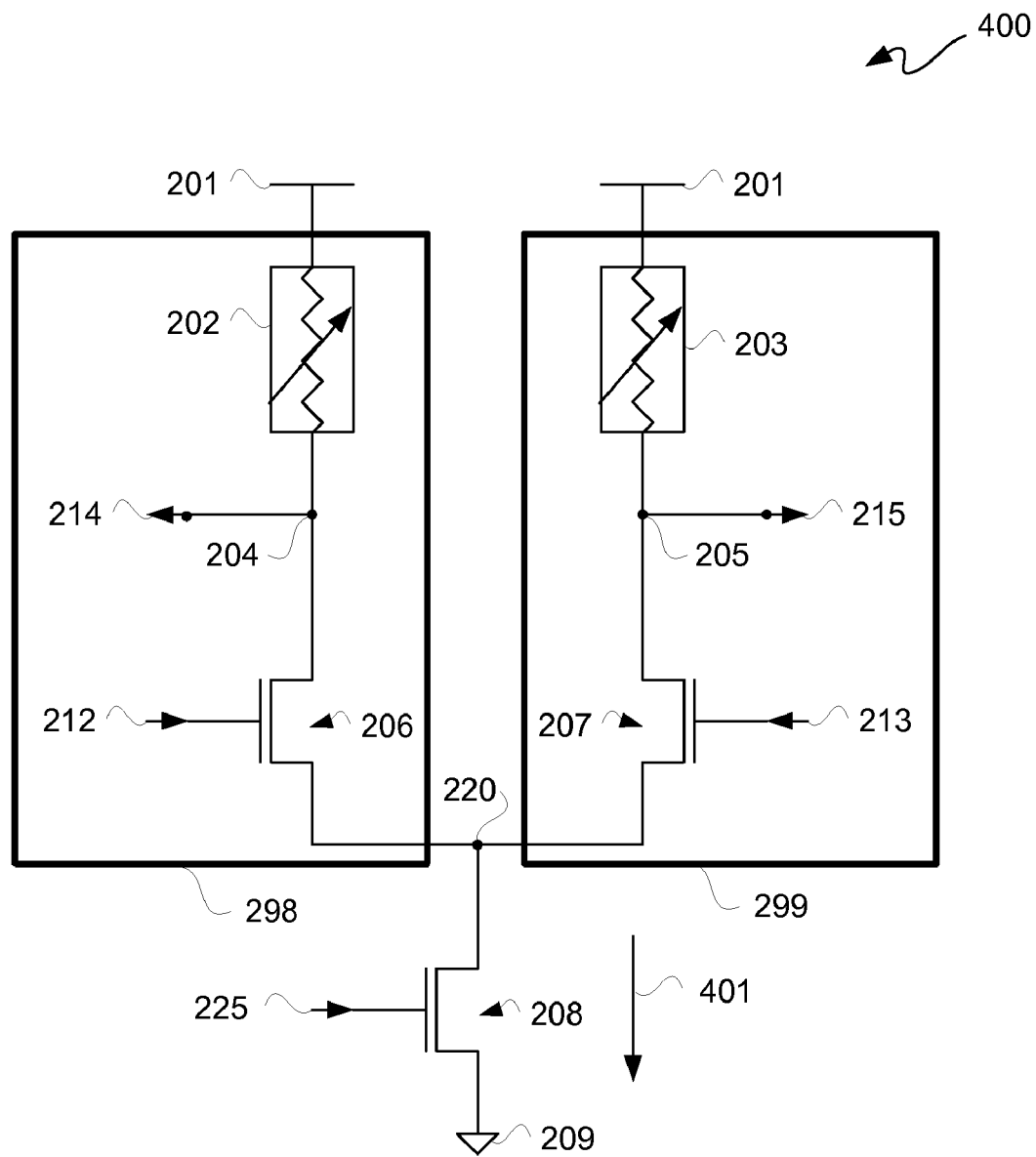
FIG. 4 is a block/circuit diagram depicting an exemplary embodiment of a Current Mode Logic operational mode for the output driver of FIG. 2.

FIG. 4 is a block/circuit diagram depicting an exemplary embodiment of another operational mode 400 for output driver 200 of FIG. 2. More particularly, operational mode 400 is a CML mode. With simultaneous reference to FIGS. 2 and 4, CML mode 400 is further described.

In a CML mode 400, transistor 208 is operated in a partially conductive state. Thus for example using the above-provided example values, a tail current 401 of approximately 20 milliamps may flow through a channel of transistor 208 from common node 220 to ground 209 as a reference tail current. In such a CML mode, n-bias signal 225 may be approximately 0.6 to 0.7 volts. In contrast, in a QPI mode 300, n-bias signal 225 may be approximately 1.2 volts. Thus in a QPI mode 300, NMOS transistor 208 is operated in a "saturated region" for conduction to ground, and in a CML mode 400, transistor 208 is operated in a forward active state, namely an active mode in a "linear region". Thus, generally it should be understood that in CML mode 400, transistor 208 is partially ON, and in QPI mode 300, transistor 208 is fully or at least near fully ON. It should be understood that output driver circuitry portions 298 and 299 of output driver 200 are each effectively using common node 220 as a virtual ground node.

It should be understood that for the above numerical examples, transistors 206 through 208 may be sized appropriately to handle the associated voltage drops associated therewith. For example, transistors 206 and 207 may each be capable of handling approximately 200 millivolts, and transistor 208 may be sized to handle approximately 150 to 250 millivolts.

It should be understood that n-bias signal 225 may be provided in any of a number of ways. For example using the above-provided example values, using a current mirror circuit, n-bias signal 225 may be provided where voltage is driven up from approximately 0.6 volts to approximately 1.2 volts for CML and QPI modes, respectively. Alternatively, rather than pulling up n-bias signal 225 for transitioning from a CML to QPI mode, or pulling down n-bias signal 225 from approximately 1.2 volts to approximately 0.6 volts for transitioning from a QPI mode to a CML mode, n-bias signal 225 may be selectively provided as either an approximately 0.6 volt voltage signal for CML mode 400 or approximately a 1.2 volt voltage signal for QPI mode 300.

With simultaneous reference to FIGS. 2 through 4, CML mode 400 and QPI mode 300 are further described. In CML mode 400, differential signaling is provided as sourced from output nodes 204 and 205 operating output driver 200 as a single differential driver. For a QPI mode 300, differential signaling is provided via output nodes 204 and 205 as though output driver 200 is two separate single-ended drivers. However, in a QPI mode 300, output driver 200 externally appears as a single differential output driver but internally operates as though it were two single-ended output drivers.

Thus, generally, n-bias control circuit 210 provides n-bias signal 225 selectively for a QPI mode and CML mode, where a first voltage level is used for the QPI mode and a second voltage level, substantially less than the first voltage level, is used for the CML mode. CML mode 400 is a supply referenced mode, where output driver 200 operates as a supply referenced driver. QPI mode 300 is a ground referenced mode, where output driver 200 operates as a ground referenced driver. Furthermore, it should be understood that CML mode 400 is a source-coupled logic mode, and QPI mode 300 is a point-to-point mode, such as a point-to-point processor interconnect mode for example.

In output driver 200, no PMOS transistors are gated with data signaling, such as data signals 212 and 213, for QPI and CML modes. Thus, putting transistor 208 in a partially conductive state allows output driver 200 to appear as differential driver to provide CML differential signaling for CML differential mode 400, where a tail current 401 passes through a channel of partially ON transistor 208 to go from common node 220 to ground node 209. Furthermore, by operating transistor 208 in at least approximately a fully conductive state for effectively providing separate paths to ground from common node 220 to ground node 209 for right and left sides of output driver 200, output driver 200, or more particularly output driver circuit portions 298 and 299, appear as two single-ended drivers 301 and 302, respectively, which in combination provide QPI differential signaling for QPI mode 300.

It should further be understood that all data signaling provided to output driver 200 is provided to gates of NMOS only transistors, namely transistors 206 and 207. In other words, no PMOS transistor receives data signaling to its gate for driving to respective output nodes, such as output nodes 204 and 205. Thus it should be understood that output driver 200 only has NMOS transistors for driving data.

Figure 5:
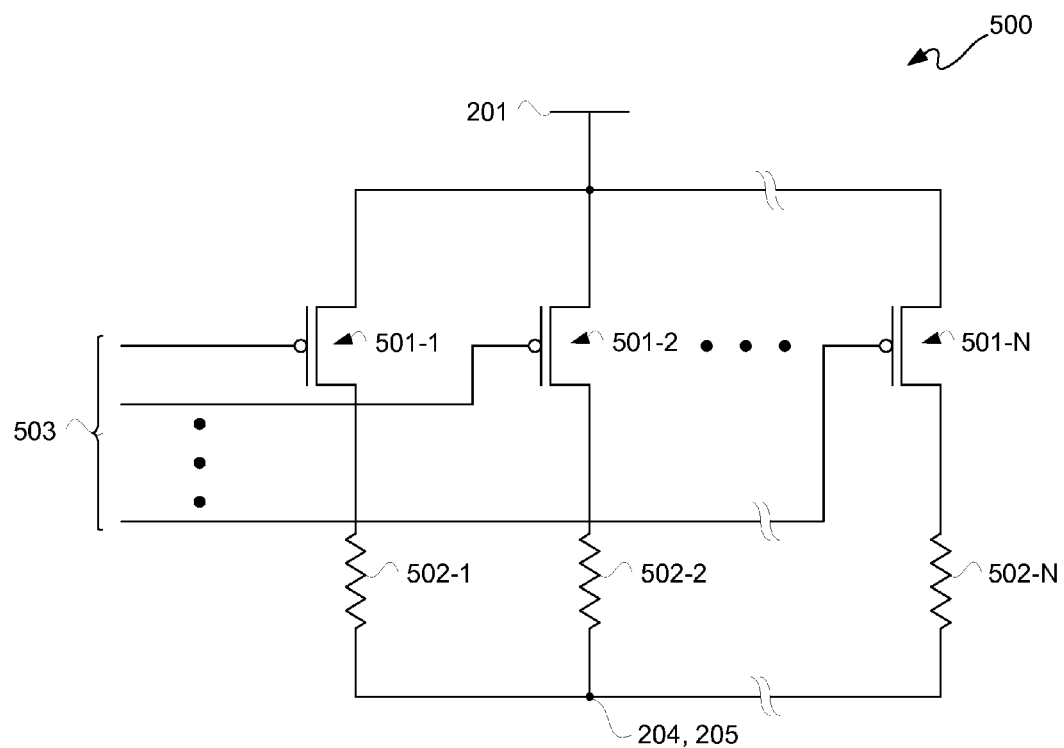
FIG. 5 is a circuit diagram depicting an exemplary embodiment of a resistive load circuit.

FIG. 5 is a circuit diagram depicting an exemplary embodiment of a resistive load circuit 500. Resistive load circuit 500 may be used for a resistive load of output driver 200 of FIG. 2, such as resistive load 202 or resistive load 203. It should be understood that resistive load circuit 500 is settable responsive to resistance control input signals 503. Accordingly, resistive load circuit 500 is a variable resistor.

In this exemplary embodiment, p-type transistors 501-1 through 501-N, for N a positive integer greater than 1, are coupled at respective drain regions thereof in series with resistors 502-1 through 502-N. Resistors 502-1 through 502-N are commonly coupled at an output node, such as output node 204 or 205. A source region of each of transistors 501-1 through 501-N are commonly coupled at supply voltage node 201.

Transistors 501-1 through 501-N are respectively gated with inputs via resistance control input signals 503. Thus depending on which of lines of resistance control input signals 503 are asserted, which is active low in this embodiment, a resistance may be set from any number of resistances provided by resistive load circuit 500. Even though PMOS is shown for transistors in resistive load circuit 500, NMOS transistors for an active high embodiment may optionally be used.

The ability to vary resistance for output driver 200 with respect to resistive loads 202 and 203 may be useful for instances where different supply voltage levels, such as from approximately 1.0 to approximately 1.5 volts for example. However, it should be understood that these or other supply voltage levels may be used. Accordingly, it should be understood that resistive load circuit 500 may be used in pairs of that circuit for output driver 200 resistive loads 202 and 203 of FIG. 2.

Figure 6:
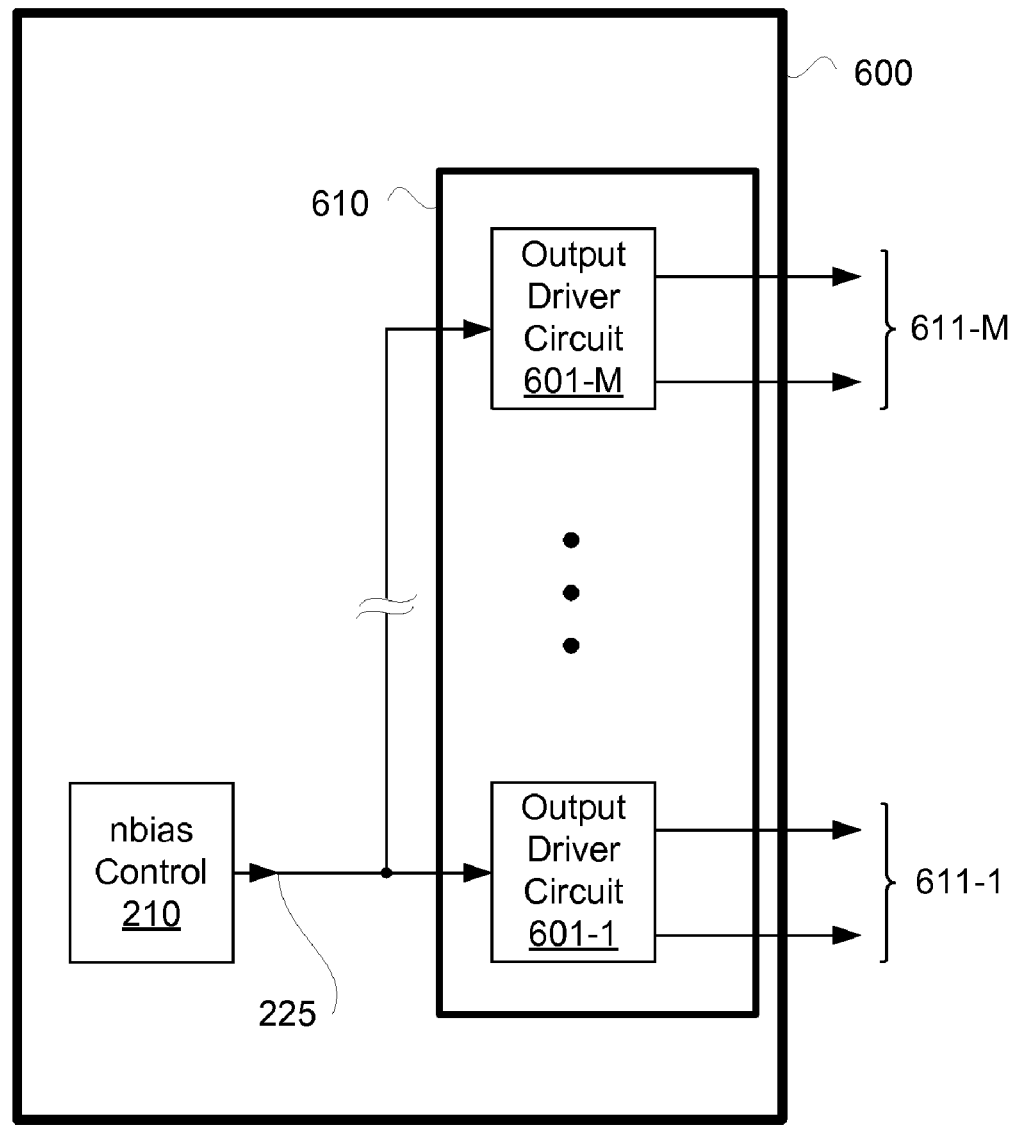
FIG. 6 is a block diagram depicting an exemplary embodiment of an integrated circuit with a bank of output drivers.

FIG. 6 is a block diagram depicting an exemplary embodiment of an IC 600. IC 600 may be an FPGA, such as FPGA 100 of FIG. 1, or any other type of IC having an output driver 200 of FIG. 2. IC 600 is further described with simultaneous reference to FIG. 2.

IC 600 includes a bank 610 of output driver circuits 601-1 through 601-M, where M is a positive integer greater than one. Output driver circuits 601-1 through 601-M may be separate instances of output driver 200 apart from n-bias control circuit 210. Accordingly, a single n-bias control circuit 210 may be coupled to each gate of transistors 208 of output driver circuits 601-1 through 601-M. Optionally, resistive loads 202 and 203 may be shared among output driver circuits 601-1 through 601-M. Thus, a single n-bias control circuit 210 may control multiple output driver circuits 601-1 through 601-M for CML and QPI, or other pair of transmission protocols, for bimodal operation. Thus output drivers 601-1 through 601-M may provide differential signal outputs 611-1 through 611-M, respectively. Such differential signal outputs 611-1 through 611-M may be either for a QPI mode or CML mode, as previously described, or other pair of transmission protocols.

Figures 7, 8:
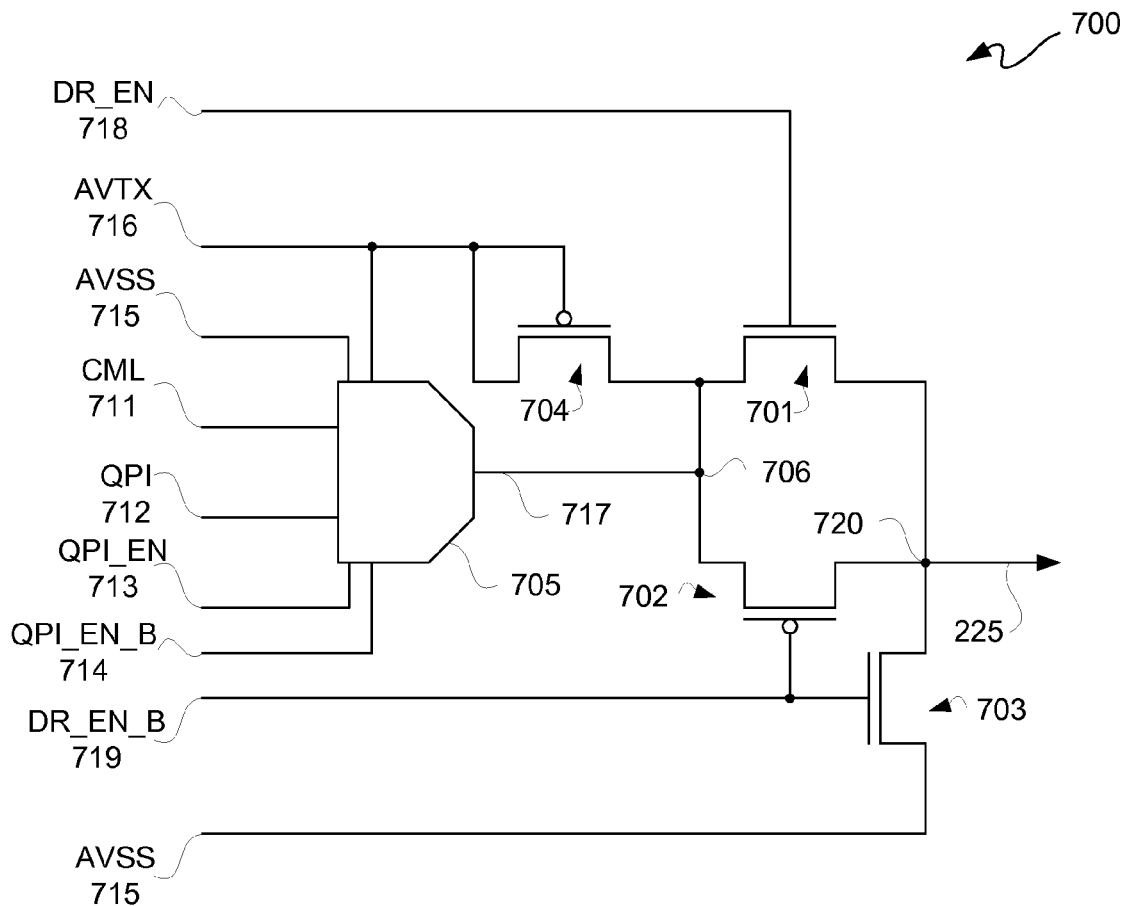
FIG. 7 is a circuit diagram depicting an exemplary embodiment of an n-bias control circuit.
FIG. 8 is a flow diagram depicting an exemplary embodiment of an operating flow for the output driver of FIG. 2.

FIG. 7 is a circuit diagram depicting an exemplary embodiment of an n-bias control circuit 700. N-bias control circuit 700 includes n-type transistor 701, p-type transistor 702, n-type transistor 703, p-type transistor 704, and a digital-to-analog converter ("DAC") 705. N-bias control circuit 700 may be n-bias control circuit 210 as previously described herein, for example with reference to FIGS. 2 and 6.

DAC 705 receives a CML mode signal 711 and a QPI mode signal 712 as data inputs thereto. CML mode signal 711 may be thought of as a baseline n-bias signal, and QPI mode signal 712 may be thought of as a signal to boost such baseline bias level up. DAC 705 receives as mode control signals a QPI enable signal 713 and its complement signal, namely QPI enable bar signal 714. Additionally, DAC 705 receives a ground signal, namely AVSS signal 715, and a transmission supply voltage signal, namely AVTX signal 716.

Output of DAC 705, namely output signal 717, is provided to node 706. DAC output signal 717 is for controlling bias voltage provided to node 706. Node 706 is commonly coupled to a source/drain region of each of transistors 701, 702, and 704.

AVTX signal 716 is provided to a source region and a gate of p-type transistor 704, as well as being provided as a supply voltage to DAC 705. A drive enable signal 718 is provided to a gate of n-type transistor 701. A complement of drive enable signal 718, namely drive enable bar signal 719, is provided as an input to gates of n-type transistor 703 and p-type transistor 702.

AVSS signal 715 is provided to a source region of transistor 703 in addition to being provided as a ground to DAC 705. A drain region of transistor 703 is coupled to n-bias output node 720. N-bias signal 225 may be sourced from n-bias output node 720. A source region of n-type transistor 701 and a drain region of p-type transistor 702, as well as a drain region of n-type transistor 703, are commonly coupled to n-bias output node 720.

Transistors 701 and 702 are configured as pass gates. Transistor 703 is used as power down device. It should be understood that a signal may be asserted active low or active high.

In a CML mode, drive enable signal 718 is asserted causing transistor 701 to be in an ON state. QPI enable bar signal 714 is asserted, and QPI enable signal 713 is not asserted. Furthermore, CML mode signal 711 is asserted for providing a baseline n-bias level, and QPI mode signal 712 is not asserted. Drive enable bar signal 719 is not asserted causing transistor 702 to be ON and transistor 703 to be OFF. DAC output 717 is thus coupled to output node 720 via transistors 701 and 702. Accordingly, voltage at node 706 is coupled to node 720 from which n-bias signal 225 may be sourced.

For a QPI mode, drive enable signal 718 is asserted causing transistor 701 to be ON. CML mode signal 711 is asserted for a baseline n-bias level, and QPI mode signal 712 is asserted for boosting such baseline n-bias level for a QPI mode. QPI enable signal 713 is asserted, and QPI enable bar signal 714 is not asserted. Drive enable bar signal 719 is not asserted during a QPI mode causing transistor 702 to be ON and transistor 703 to be OFF. DAC 705 raises DAC output voltage 717 from a CML mode level to a QPI mode level for n-bias signal 225. Transistors 701 and 702 are both ON, and transistor 703 is OFF. DAC output 717 is thus coupled to output node 720 via transistors 701 and 702. Accordingly, voltage at node 706 is coupled to node 720 from which n-bias signal 225 may be sourced.

For a power down mode, drive enable bar signal 719 is asserted. Thus, transistor 702 is OFF, and transistor 703 is ON. Transistor 703 being ON pulls down voltage at n-bias output node 720 to AVSS 715.

By having an n-bias signal level be changeable between two different levels, a same output driver circuit may be bimodal, namely used for both a CML mode and a QPI mode for example. Furthermore, it should be understood that all data driver transistors are NMOS, as well as a pull down transistor for a virtual ground. Thus, an NMOS bimodal interface may be provided.

Apart from n-bias control circuit 210 and programmable resistance circuits, such as described with reference to FIGS. 5A and 5B, output driver 200 may be an entirely NMOS device. More particularly, output data driver transistors forming an output driver circuit along with a pull down transistor may be an entirely NMOS device.

FIG. 8 is a flow diagram depicting an exemplary embodiment of an operating flow 800 for output driver 200 of FIG. 2. Operating flow 800 is further described with simultaneous reference to FIGS. 2 through 4 and 8

At 801, a bias signal, such as n-bias signal 225, is selectively provided from a bias control circuit, such as bias control circuit 210, to an output driver circuit, such as formed in part with transistors 706 through 708. It should be understood that discrete resistors may be used for resistive loads 202 and 203, in which case output driver circuit portions, in which embodiment output driver circuit 290 of FIG. 2 may include no PMOS devices. Again, it should be understood that data driver transistors 206 and 207 of output driver 200 are NMOS devices.

The bias signal provided at 801 may have a first voltage level associated with operation of the output driver circuit in a first mode, such as a CML mode 400, and a second voltage level associated with operation of such output driver circuit in a second mode, such as a QPI mode 300.

At 802, the output driver circuit is operated in either the first mode or the second mode. In the first mode, the output driver operates as a supply referenced driver, such as a CML mode for example, and in the second mode, the output driver operates as a ground referenced driver, such as a QPI mode for example. The first mode includes gating a first NMOS transistor, such as transistor 208 with a bias signal, such as n-bias signal 225, at the first voltage level to cause partial conduction of the first NMOS transistor for conducting from a first node, such as common node 220, to a ground node, such as ground node 209, to provide a tail current, such as tail current 401, from such first node to such ground node. In the first mode, partial conduction is effectively shared by a second NMOS transistor and a third NMOS transistor, such as NMOS transistors 206 and 207, for providing first differential output signaling, such as CML differential output signaling.

The second mode includes gating the first NMOS transistor with the bias signal at a second voltage level to cause at least approximately full conduction of the first NMOS transistor for conducting from the first node to the ground node. In the second mode, the at least approximately full conduction effectively shorts the first node to the ground node for operation of the second NMOS transistor and the third NMOS transistor as separate parts of respective single-ended drivers for second differential output signaling, such as QPI differential output signaling for example. Again, even though the term "effectively" shorts is used, it should be understood that there may be some load, though it is very small, as a QPI mode does not necessarily completely bring down a ground or logic low voltage level to zero volts. Thus, as in the above example, the coupling to ground may be a virtual ground, and such virtual ground may be approximately but not necessarily equal to 0 volts.

It should be understood that the first mode may be a source coupled logic mode, and the second mode may be a point-to-point interconnect mode. It should further be understood that all data signaling provided to the output driver circuit may be provided to the second NMOS transistor and the third NMOS transistor as differential data signals. Again, the first mode may be a CML mode, and the second mode may be a QPI mode.

Accordingly, it should be understood that bimodal output drivers for selectively operating in either a supply reference mode or a ground reference mode have been described. Such bimodal output drivers may be coupled to receive bias signaling for placing the bimodal output drivers in either the supply reference mode or the ground reference mode. The bimodal output drivers do not use PMOS devices to gate data inputs, and thus avoid issues associated with PMOS driver transistors as described herein. Thus, the bimodal output drivers use only NMOS devices to gate data inputs.

QPI support with a CML interface with only n-type driver transistors and an n-type tail current device has been described. An output driver circuit may function like pair of n-type data drive transistors with respective voltage pull-down resistors and coupled at a common node virtually coupled to ground via another n-type transistor. In a QPI mode, such output circuit driver receives a high gating voltage, such as a Vcc voltage level, to avoid a "headroom" issue with respect to providing a virtual ground at such common node. Thus, the common node may be effectively shorted to ground. A result in a QPI mode is effectively two single-ended driver circuits coupled to a common virtual ground with little to practically no tail current. Furthermore, for supporting non-QPI devices, such as CML or other devices for example, such gating voltage may be coupled to a low voltage level or to ground to turn the shorting transistor to partially ON or OFF. If transistor 208 is in an OFF state, source regions of transistors 206 and 207 may be electrically floated.

By providing an NMOS only output driver circuit, it should be understood that susceptibility to turning on such NMOS transistors is limited to an applied voltage in contrast to inadvertent grounding. Furthermore, it should be understood that generally NMOS transistors transition faster than PMOS transistors. Thus, having NMOS only driver transistors for both ground and supply referenced modes, such as QPI and CML modes for example, facilitates high speed operation for both of such modes as PMOS driver transistors are avoided.

It should be understood that the above-described output driver may be used for applications involving transmission rates in excess of a giga-bit per second ("Gbps"). The above-described driver may be used for both AC-coupled and DC coupled modes to a specified resistance, such as 50 ohms. In the following description, a predriver that may be used with the above described output driver is described. Such predriver may be used to provide an analog level for such output driver as a CML driver during an AC coupling mode and be used to generate a CMOS level for such output driver as a QPI driver during a DC coupling mode.

Figure 9A:
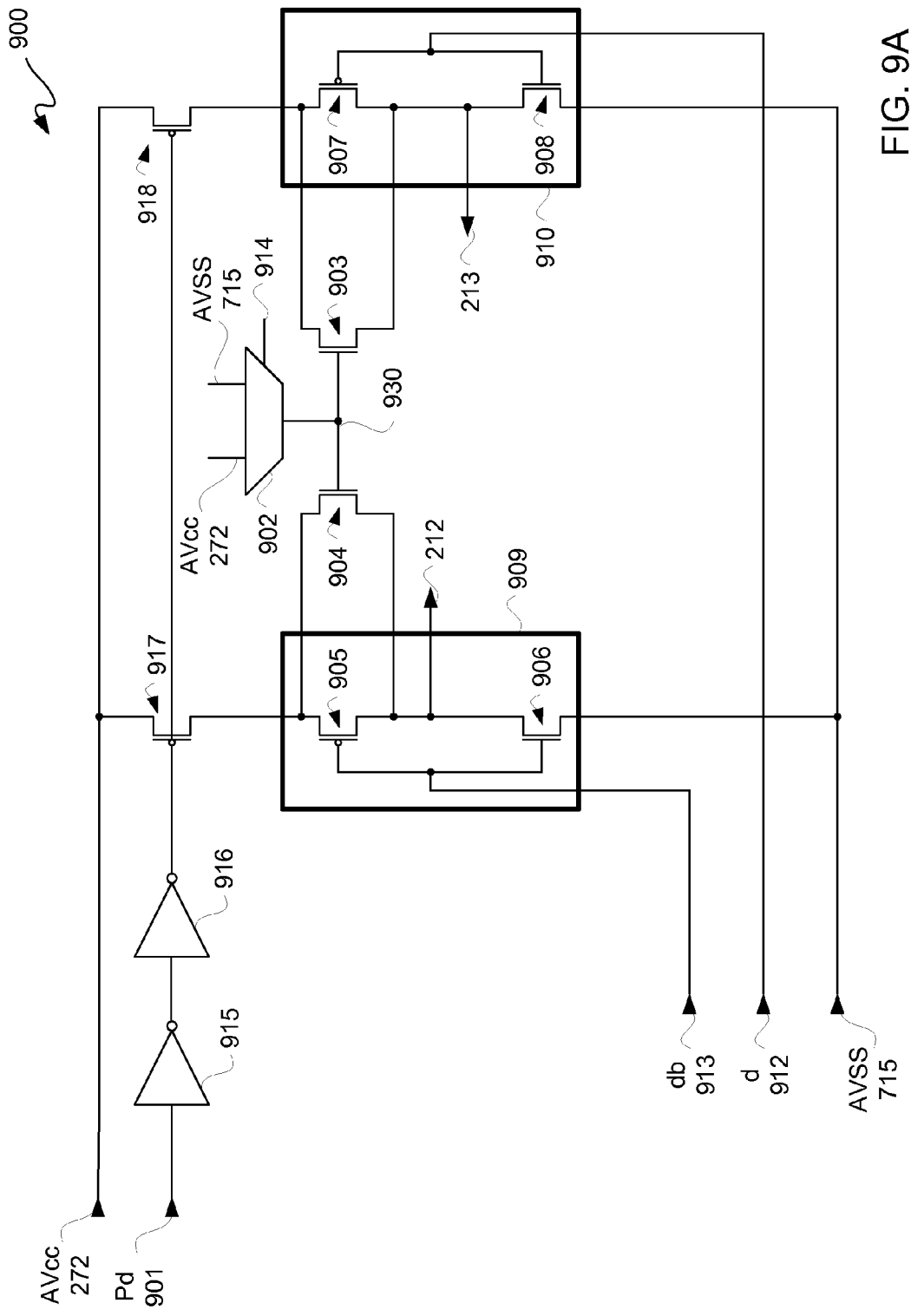
FIGS. 9A and 9B are circuit diagrams depicting respective exemplary embodiments of a predriver.

FIG. 9A is a circuit diagram depicting an exemplary embodiment of a predriver 900. Predriver 900 includes inverters 909, 910, 915 and 916, multiplexer 902, NMOS transistors 903 and 904, and PMOS transistors 917 and 918.

A supply voltage level, such as AVcc 272, is coupled to source nodes of PMOS transistors 917 and 918. An input of inverter 915 is coupled to receive power down ("Pd") signal 901, and an output of inverter 915 is coupled to an input of inverter 916. An output of inverter 916 is coupled to gates of transistors 917 and 918. Thus, when power down signal 901 is asserted, transistors 917 and 918 are turned OFF decoupling inverters 909 and 910 from AVcc 272. When power down signal 901 is not asserted, output of inverter 916 is logic low for holding transistors 917 and 918 in ON states for coupling AVcc 272 to inverters 909 and 910.

Each of inverters 909 and 910 is composed of a PMOS transistor and an NMOS transistor. More particularly, inverter 909 includes PMOS transistor 905 and NMOS transistor 906, and inverter 910 includes PMOS transistor 907 and NMOS transistor 908. A drain node of transistor 917 is coupled to a source node of transistor 905, and a drain node of transistor 918 is coupled to a source node of transistor 907. An input node of inverter 909 is coupled to receive a data bar signal ("db") 913, and an input node of inverter 910 is coupled to receive a data signal ("d") 912, where signals 912 and 913 are complementary signals. An input node of inverter 909 is coupled to gates of transistors 905 and 906, and an input node of inverter 910 is coupled to gates of transistors 907 and 908. A source node of each of transistors 906 and 908 is coupled to a ground, such as AVSS 715 for example. Drain nodes of transistors 905 and 906 are coupled to one another at an output node of inverter 909, from which output node data signal 212 is sourced for output driver 200 of FIG. 2. Drain nodes of transistors 907 and 908 are coupled to one another at an output node of inverter 910, from which output node data signal 213 is sourced for output driver 200 of FIG. 2.

A select circuit, such as multiplexer 902 for example, is coupled to receive a first input voltage and a second input voltage of different levels, such as a logic supply voltage level for example AVcc 272 and a ground voltage level for example AVSS 715, for outputting either as a selected signal, such as gating signal 930. Again, logic supply voltage level AVcc is less than a transmit supply voltage level AVTX. Multiplexer 902 may be coupled to receive a control select signal, such as control select signal 914, for selecting as between the first and second input voltages for output from multiplexer 902. Control select signal 914 may be responsive to whether a CML mode or a QPI mode is asserted, as described below in additional detail.

A first clamp circuit and a second clamp circuit are coupled to receive gating signal 930. In this embodiment, the first clamp circuit is an NMOS transistor 904 coupled in source-drain parallel with PMOS transistor 905 of inverter 909, and transistor 904 is gated with the selected signal, namely gating signal 930. Moreover, in this embodiment, the second clamp circuit is an NMOS transistor 903 coupled in source-drain parallel with PMOS transistor 907 of inverter 910, and transistor 903 is gated with the selected signal, namely gating signal 930. It should be understood that predriver 900 is for differential signaling at a high data rate, such as in excess of a Gbps. Thus, two symmetrical circuits, namely two inverters 909 and 910 and associated clamping transistors 904 and 903, are used.

In this embodiment for a CML mode, control select signal 914 selects AVcc 272 for output from multiplexer 902. Accordingly, both of transistors 903 and 904 would be turned ON in response to application of AVcc 272 to their respective gates. Transistors 903 and 904 in such a CML mode may operationally be thought of as diodes. So, for example, if data bar signal 913 is logic high, transistor 905 is OFF but transistor 904 is ON along with transistor 906. Thus, rather than pulling an output node of inverter 909 to AVSS 715, conduction from AVcc 272 across transistors 917 and 904 pulls voltage at such output node up toward AVcc 272. In other words, transistors 904 and 905 may be thought of as resistors in parallel, where resistance of transistor 905 is large in comparison to resistance of transistor 904. It should be understood that even when OFF, thin dielectric transistors have some small amount of source-to-drain leakage current. Accordingly, the main of the voltage drop is across NMOS transistor 904, which may be approximately Vgs-Vt. So in a CML mode, which is an AC coupled mode, voltage at an output node of inverter 909 provides a data signal 212 that transition from approximately AVcc/2 to AVcc. For example, if AVcc is approximately 1 volt, data signal 212 may transition from approximately 0.6 volts to approximately 1 volt during operation. So, data signal 212 may be thought of as an analog signal.

Even though the above description was limited to inverter 909 and transistor 904 for purposes of clarity, it should be understood from such description that inverter 910 and transistor 903 operate the same as described but with data signals 912 and 913 being complementary for differential signaling.

In this embodiment for a QPI mode, namely a DC coupled mode, control select signal 914 selects AVSS 715 for output from multiplexer 902. Accordingly, both of transistors 903 and 904 would be turned OFF in response to application of AVSS 715 to their respective gates. So in a QPI mode, which is a DC coupled mode, voltage at respective output nodes of inverters 909 and 910 for provide data signal 212 and 213 that transition from approximately AVSS to AVcc. For example, if AVcc is approximately 1 volt and AVSS is approximately 0 volts, data signals 212 and 213 may transition from approximately 0 volts to approximately 1 volt, namely CMOS levels, as complementary differential digital signals.

Figure 9B:
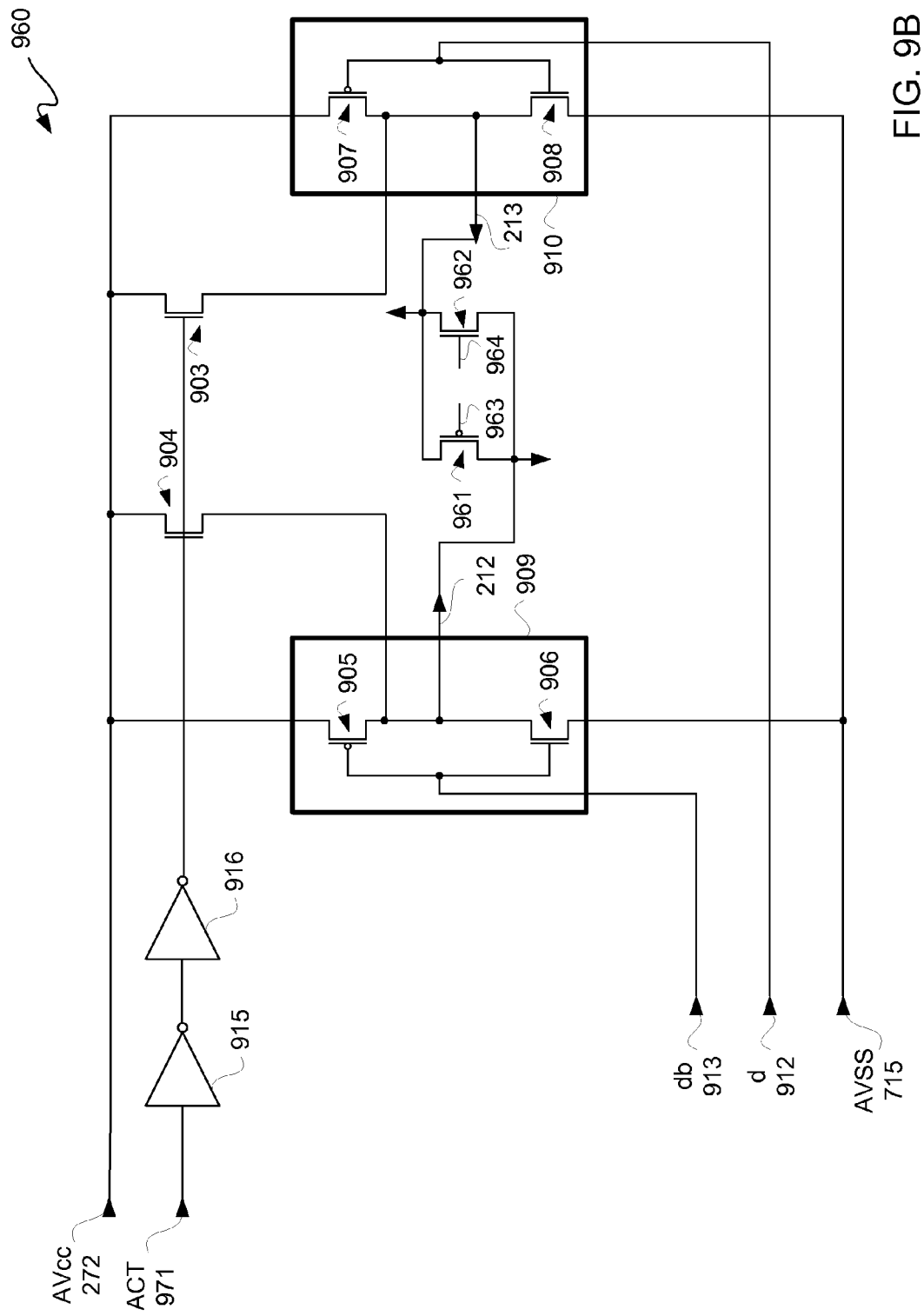

FIG. 9B is a circuit diagram depicting an exemplary embodiment of a predriver 960. Predriver 960 includes inverters 909, 910, 915 and 916, multiplexer 902, and NMOS transistors 903 and 904, NMOS transistor 962, and PMOS transistor 961. As predriver 960 is similar to predriver 900 of FIG. 9A, generally only the differences are described for purposes of clarity.

A clamp activation signal 971 for switching between an AC coupled mode, such as a CML mode, and a DC coupled mode, such as a QPI mode, is provided as an input to inverter 915. Thus, rather than having a clamp signal sourced from a multiplexer output, such clamp signal is sourced from output of an inverter.

Output of inverter 916 is provided to the gates of NMOS transistors 903 and 904. For this embodiment, for a CML mode, clamps are active, namely activation signal 971 and output of inverter 916 are logic high for putting transistors 903 and 904 in an ON state, and for a QPI mode, clamps are inactive, namely activation signal 971 and output of inverter 916 are logic low for putting transistors 903 and 904 in an OFF state.

In this embodiment, transistors 905 and 907 have their source nodes directly coupled to a bus for AVcc 272. Transistors 904 and 905, as well as transistors 903 and 907, are still coupled in source-drain parallel; however, drains of transistors 903 and 904 are likewise directly coupled to a bus for AVcc 272. Thus, a multiplexer may be omitted in this embodiment in contrast to the embodiment of FIG. 9A.

Optionally, an idle circuit formed of transistors 961 and 962 may be used. Pre-driven data signal 212 is coupled to a source/drain node of transistors 961 and 962, and pre-driven data signal 213 is coupled to another source/drain node of transistors 961 and 962, where transistors 961 and 962 are coupled in source drain parallel. An idle bar signal 963 and an idle signal 962, which are complementary signals, may respectively gate transistors 961 and 962. When idle signals 963 and 964 are asserted to idle predriver 960, output nodes of inverters 909 and 910 are effectively shorted together by putting both of transistors 961 and 962 in an ON state. When predriver 960 is not in an idle state, transistors 961 and 962 are both OFF, meaning idle signals 963 and 964 are not asserted.

Figure 10A:
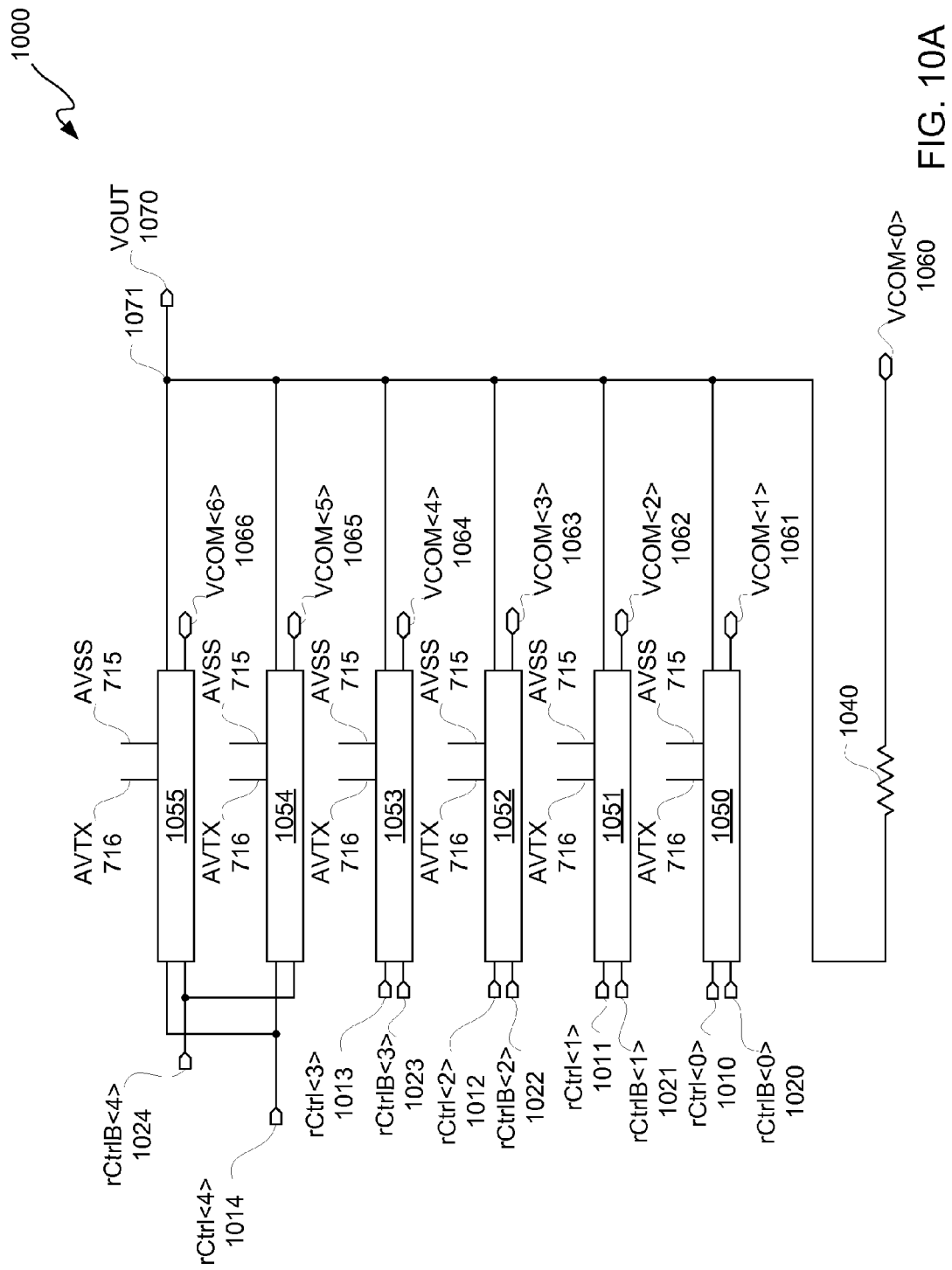
FIG. 10A is a block/circuit diagram depicting an exemplary embodiment of programmable termination circuit that may be used in the output driver of FIG. 2.

FIG. 10A is a block/circuit diagram depicting an exemplary embodiment of programmable termination circuit 1000. Programmable termination circuit 1000 may be used in high frequency applications, such as in excess of a Gbps data rate. With simultaneous reference to both FIGS. 2, 5 and 10, programmable termination circuit 1000 is further described.

For purposes of clarity by way of example and not limitation, it shall be assumed that a 50 ohm termination is specified. However, it should be understood that other termination resistances may be used. Resistive load 202 and 203 are termination resistances. These termination resistances may be trimmed, such as by using resistance control input signals 503 supplied to resistive load circuits 500 used to provide resistive loads 202 and 203. Resistive load circuit 500 may be replaced with programmable termination circuit 1000.

Common voltage signaling ("VCOM")<6:0> may be coupled to a power supply. The same as resistance control input signals 503 may be resistance bar control signals 1020 through 1024 in this exemplary embodiment. A base common voltage level for programmable termination circuit 1000 may be provided with VCOM<0> signal 1060 provided across resistor 1040, and such base common voltage may be sourced from output node 1071 as output voltage ("VOUT") 1070. This may be a maximum current level, and each of voltage divider blocks 1050 through 1055 may be used to reduce such current level, where blocks 1050 to 1054 and 1055 in combination provide a binary sequence. An example sequence may be 0.5, 1, 2, 4, and 8, where blocks 1054 and 1055 are two 4s combined to provide an 8. It should be understood that resistance of resistor 1040 may be relatively high for ESD protection; however, such resistance may be divided down by having multiple resistors, or programmable resistance termination circuits 1000, in parallel.

Each of blocks 1050 through 1055 may be biased between AVTX 716 and AVSS 715. However, AVSS 715 may be a virtually coupled ground depending on frequency of operation, such as capacitively coupled. Blocks 1050 through 10555 may respectively receive pairs of complementary control signals, such as from resistance bar control signals 1020 through 1024 and resistance control signals 1010 through 1014. Furthermore, common voltage signals 1061 through 1066 may be respectively coupled to blocks 1050 through 1055. Outputs of each of blocks 1050 through 1055 are coupled to output node 1071. Output node 1071 may be coupled to an output node of an output driver, such an output node 204 or 205. Accordingly, at least two programmable termination circuits 1000 may be used for a differential output driver.

Figure 10B:
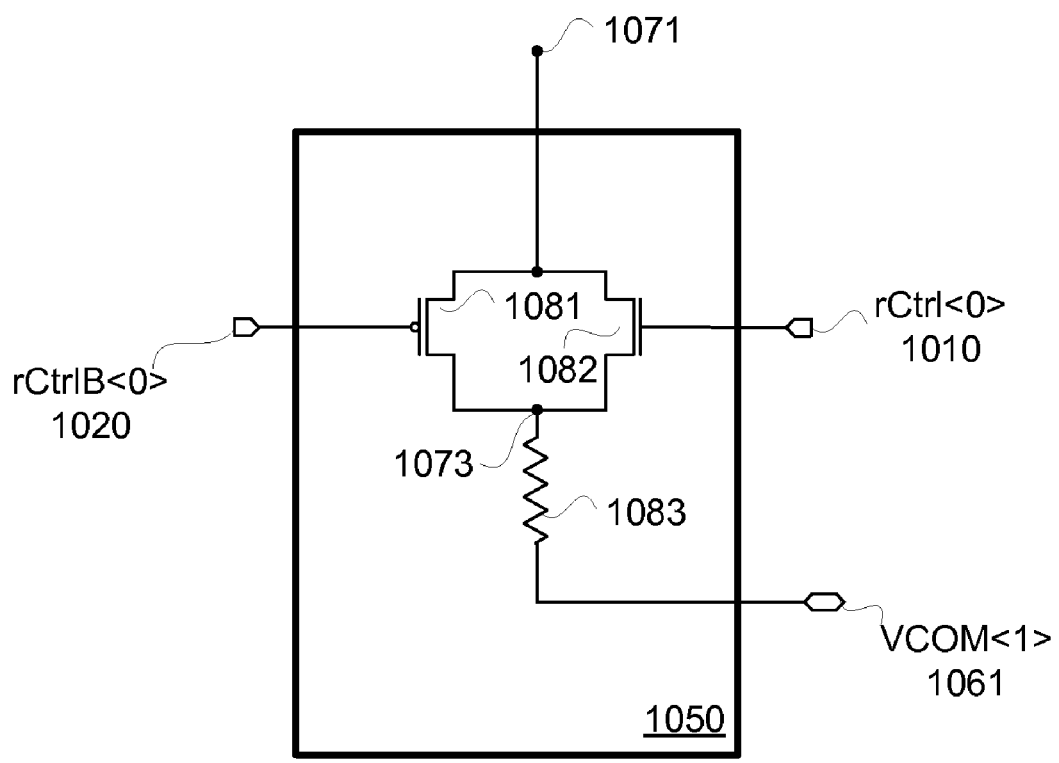
FIG. 10B is a circuit diagram depicting an exemplary embodiment of voltage divider block of the programmable termination circuit of FIG. 10A.

FIG. 10B is a circuit diagram depicting an exemplary embodiment of voltage divider block 1050 of FIG. 10A. For purposes of clarity and not limitation, only voltage divider block 1050 is described, as such description is basically the same for voltage divider blocks 1051 through 1055. For purposes of clarity and not limitation, supply and ground biasing of voltage divider block 1050 is not shown.

Voltage divider block 1050 includes PMOS transistor 1081, NMOS transistor 1082, and resistor 1083. A gate of transistor 1081 is coupled to receive resistance bar control signal 1020, and a gate of transistor 1082 is coupled to receiver resistance control signal 1010. Accordingly, if transistor 1081 is ON, so is transistor 1082, and if transistor 1082 is OFF, so is transistor 1081. Transistors 1081 and 1082 are coupled in source drain parallel, so if both are OFF, voltage divider block basically does not contribute anything to output node 1071.

Assuming both of transistors 1081 and 1082 are ON, then common voltage 1061 is provided to resistor 1083. Another end of resistor 1083 is coupled to node 1073, and node 1073 is a source/drain common node of transistors 1081 and 1082. Another source/drain common node of transistors 1081 and 1082 is output node 1071. Thus, when both transistors 1081 and 1082 are on, current from common voltage 1061 passed from node 1073 to node 1071, meaning the voltage drop across resistor 1083 is contributed to output voltage 1070. In other words, resistance associated with resistor 1083 is contributed to termination resistance as effectively being in parallel with resistor 1040.

Figure 11:
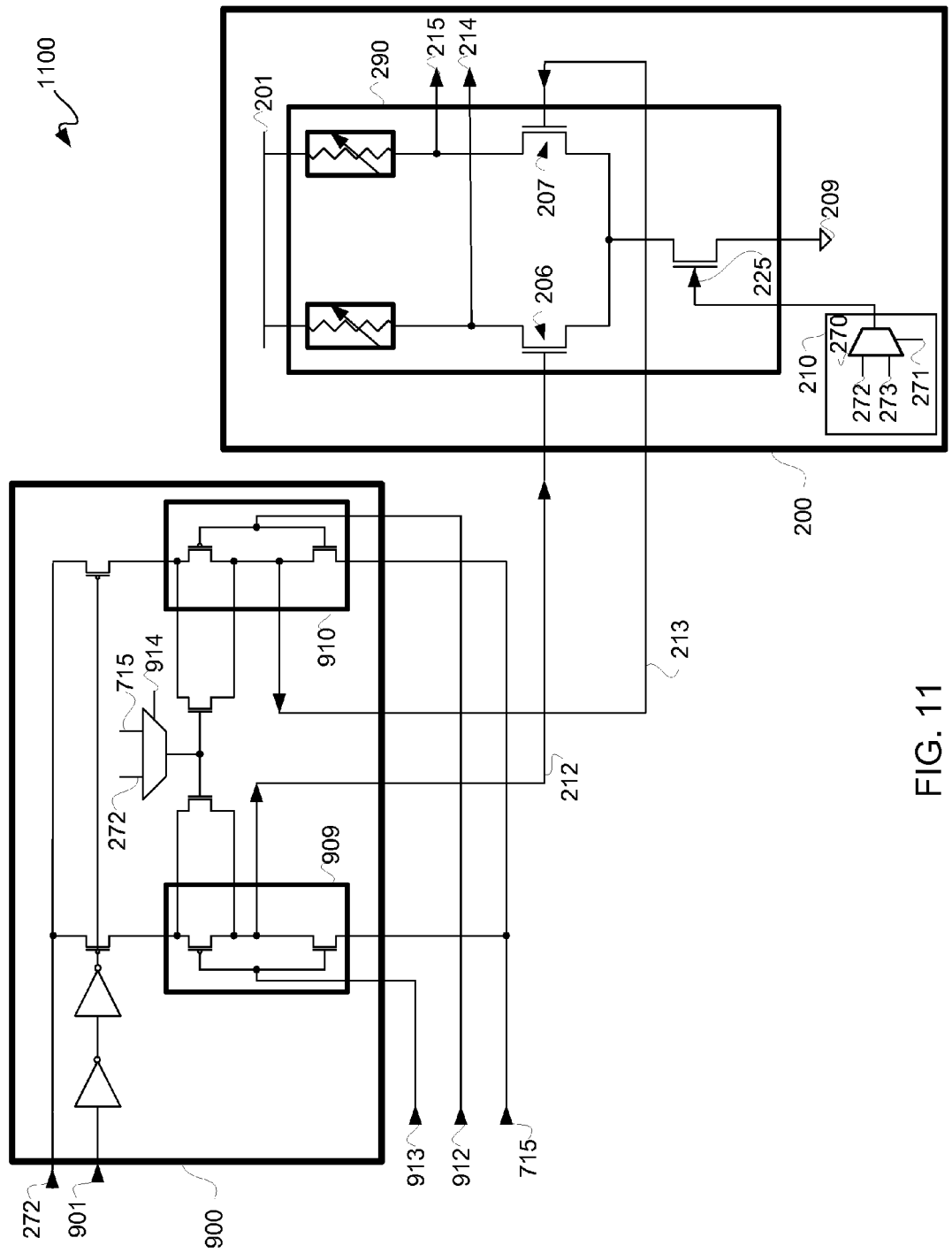
FIG. 11 is a circuit diagram depicting an exemplary embodiment of a system having the output driver of FIG. 2 and the predriver of FIG. 9.

FIG. 11 is a circuit diagram depicting an exemplary embodiment of a system 1100. System 1100 includes predriver 900 and output driver 200. Pre-driven data signals 212 and 213 from inverters 909 and 910, respectively, of predriver 900 are provided to output driver 200. More particularly, a gate of NMOS driver transistor 206 of output driver 200 receives pre-driven data signal 212, and a gate of NMOS driver transistor 207 of output driver 200 receives pre-driven data signal 213. It should further be understood that by pre-driving data signals to CML or QPI voltages, transitioning output driver 200 as between CML and QPI modes at Gbps data rates is facilitated.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, even though a CML mode and a QPI mode have been described, embodiments of drivers described herein may be used with other transmission modes. Claim(s) listing steps do not imply any order of the steps. Trademarks are the property of their respective owners.

What is claimed is:

1. An integrated circuit driver, comprising:
    a bias control circuit to provide a bias signal for a first mode and a second mode; wherein the bias signal has a first voltage level associated with operation in the first mode and a second voltage level associated with operation in the second mode;
    an output driver circuit to receive the bias signal, the output driver circuit including a first NMOS transistor that is gated with the bias signal, and only the first NMOS transistor is biased for operating the output driver in the first and second modes;
    wherein the output driver circuit operates in the first mode in response to the first NMOS transistor being partially conductive, in response to the first voltage level of the bias signal, wherein when the first NMOS transistor is partially conductive the first NMOS transistor is in a linear region of operation that is closer to a saturation region of operation of the first NMOS transistor than to a region of operation of zero drain-to-source voltage, and operates in the second mode in response to the first NMOS transistor being fully conductive in response to the second voltage level of the bias signal;
    wherein in the first mode, the output driver circuit operates as a supply referenced driver; and
    wherein in the second mode, the output driver circuit operates as a ground referenced driver.

2. The integrated circuit driver according to claim 1, wherein:
    the first mode is a source-coupled logic mode;
    the second mode is a point-to-point processor interconnect mode; and
    wherein only NMOS transistors are gated with data signaling for the first mode and the second mode.

3. The integrated circuit driver according to claim 1, wherein the output driver circuit includes:
    a first NMOS transistor gated with the bias signal;
    in the first mode,
        the first NMOS transistor has a tail current passing through a channel thereof to a ground node, the first NMOS transistor is operated in a partially conductive state; and
        the output driver circuit performs as a differential driver which provides first differential signaling for the first mode;
    in the second mode,
        the first NMOS transistor is operated in at least approximately a fully conductive state for effectively providing separate paths to the ground node; and
        the output driver circuit performs like two single-ended drivers which in combination provide second differential signaling for the second mode.

4. The integrated circuit driver according to claim 3, wherein the output driver circuit further includes:
    a second NMOS transistor gated with a first data input signal;
    a third NMOS transistor gated with a second data input signal; and
    wherein all data signaling provided to the output driver circuit is provided to the second NMOS transistor and the third NMOS transistor.

5. The integrated circuit driver according to claim 4, wherein:
    a first node is common with each first source/drain node of the first NMOS transistor, the second NMOS transistor, and the third NMOS transistor;
    a second source/drain node of the first NMOS transistor is coupled to the ground node;
    a second source/drain node of the second NMOS transistor is coupled to a first output node;
    a second source/drain node of the third NMOS transistor is coupled to a second output node;
    a first resistance circuit is coupled between the first output node and a supply voltage node; and
    a second resistance circuit is coupled between the second output node and the supply voltage node.

6. The integrated circuit driver according to claim 5, wherein the output driver circuit is entirely an NMOS device.

7. A system comprising:
    the integrated circuit driver of claim 1; and
    a predriver, coupled to the integrated circuit driver, comprising:
        a select circuit configured to receive a first input voltage and a second input voltage of different levels for outputting either as a selected signal;
        a first clamp circuit and a second clamp circuit configured to receive the selected signal;
        a first inverter coupled to the first clamp circuit and configured to receive a first data input signal;
        a second inverter coupled to the second clamp circuit and configured to receive a second data input signal;
        wherein the first data input signal and the second data input signal are complementary signals; and
        wherein a first data output signal of the first inverter and a second data output signal of the second inverter are for an AC coupled mode or a DC coupled mode responsive to the selected signal.

8. The predriver according to claim 7, wherein:
    the first clamp circuit is a first NMOS transistor coupled in source-drain parallel with a first PMOS transistor of the first inverter and gated with the selected signal;
    the second clamp circuit is a second NMOS transistor coupled in source-drain parallel with a second PMOS transistor of the second inverter and gated with the selected signal;
    the first input voltage is a logic supply voltage level that is less than a transmit supply voltage level;
    the second input voltage is a ground voltage level; and
    the first data output signal and the second data output signal are provided as analog signals for the AC coupled mode and digital signal for the DC coupled mode.

9. A system comprising:
    the integrated circuit driver of claim 1; and
    a predriver, coupled to the integrated circuit driver, comprising:
        a first clamp circuit and a second clamp circuit configured to receive a clamp activation signal;
        a first inverter coupled to the first clamp circuit and configured to receive a first data input signal;

a second inverter coupled to the second clamp circuit and configured to receive a second data input signal;

wherein the first clamp circuit, the second clamp circuit, the first inverter, and the second inverter each have a source/drain node directly coupled to a voltage supply bus;

wherein the first data input signal and the second data input signal are complementary signals; and wherein a first data output signal of the first inverter and a second data output signal of the second inverter are for an AC coupled mode or a DC coupled mode responsive to the clamp activation signal.

10. The predriver according to claim 9, further comprising:
idle circuit configured to receive the first data output signal and the second data output signal; and
the idle circuit including transistors for selectively shorting output nodes of the first inverter and the second inverter responsive to idle signaling.

11. The integrated circuit driver according to claim 1, further comprising a predriver circuit configured to:
in response to the output driver circuit operating as a ground reference driver:
generate a first data signal and a second data signal, each having transitions between a first voltage and a second voltage; and
provide the first data signal to a first input of the output driver circuit and the second data signal to a second input of the output driver circuit; and
in response to the output driver circuit operating as a supply reference driver:
generate a third data signal and a fourth signal, each having transitions between the first voltage and a third voltage that is approximately halfway between the first voltage and the second voltage; and
provide the third data signal to the first input of the output driver circuit and the fourth data signal to the second input of the output driver circuit.

12. A method for operating an integrated circuit driver, comprising:
providing a bias signal from a bias control circuit to an output driver circuit;
wherein the bias signal has a first voltage level associated with operation of the output driver circuit in a first mode and a second voltage level associated with operation of the output driver circuit in a second mode;
operating the output driver circuit in either the first mode or the second mode;
wherein the output driver circuit includes a first NMOS transistor that is gated with the bias signal, and only the first NMOS transistor is biased for operating the output driver in the first or second mode;
wherein the output driver circuit operates in the first mode in response to the first NMOS transistor being partially conductive in response to the first voltage level of the bias signal, wherein when the first NMOS transistor is partially conductive the first NMOS transistor is in a linear region of operation that is closer to a saturation region of operation of the first NMOS transistor than to a region of operation of zero drain-to-source voltage, and operates in the second mode in response to the first NMOS transistor being fully conductive in response to the second voltage level of the bias signal;
wherein in the first mode, the output driver circuit operates as a supply referenced driver; and
wherein in the second mode, the output driver circuit operates as a ground referenced driver.

13. The method according to claim 12, wherein the first mode includes gating a first NMOS transistor with the bias signal at the first voltage level to cause partial conduction of the first NMOS transistor for conducting from a first node to a ground node to provide a tail current from the first node to the ground node.

14. The method according to claim 13, wherein the second mode includes gating the first NMOS transistor with the bias signal at the second voltage level to cause at least approximately full conduction of the first NMOS transistor for conducting from the first node to the ground node.

15. The method according to claim 14, wherein:
in the first mode, the partial conduction is effectively shared by a second NMOS transistor and a third NMOS transistor for first differential output signaling; and
in the second mode, the at least approximately full conduction effectively shorts the first node to the ground node for operation of the second NMOS transistor and the third NMOS transistor as separate parts of respective single-ended drivers for second differential output signaling.

16. The method according to claim 15, wherein:
the first mode is a source-coupled logic mode; and
the second mode is a point-to-point interconnect mode.

17. The method according to claim 16, wherein all data signaling provided to the output driver circuit is provided to the second NMOS transistor and the third NMOS transistor.

18. The method according to claim 16, wherein the output driver circuit is entirely an NMOS device.

19. A predriver, comprising:
a first clamp circuit and a second clamp circuit gated with a clamp signal;
a first inverter coupled to the first clamp circuit and configured to receive a first data input signal;
a second inverter coupled to the second clamp circuit and configured to receive a second data input signal;
wherein the first data input signal and the second data input signal are complementary signals; and
wherein a first data output signal of the first inverter and a second data output signal of the second inverter are for an AC coupled mode or a DC coupled mode responsive to the clamp signal.

20. A system, comprising:
the predriver of claim 19; and
a driver, coupled to the predriver, comprising:
a bias control circuit to provide a bias signal for a first mode and a second mode;
the bias signal having a first voltage level associated with operation in the first mode and a second voltage level associated with operation in the second mode;
an output driver circuit to receive the bias signal;
wherein in the first mode, the output driver circuit operates as a supply referenced driver; and
wherein in the second mode, the output driver circuit operates as a ground referenced driver.

* * * * *